United States Patent
Boettcher et al.

(10) Patent No.: US 9,911,816 B2
(45) Date of Patent: Mar. 6, 2018

(54) SEMICONDUCTIVE DEVICE AND ASSOCIATED METHOD OF MANUFACTURE

(71) Applicant: NXP B.V., Eindhoven (NL)

(72) Inventors: Tim Boettcher, Hamburg (DE); Reza Behtash, Hamburg (DE); Thomas Igel-Holtzendorff, Hamburg (DE); Linpei Zhu, Shanghai (CN)

(73) Assignee: Nexperia B.V., Eindhoven (NL)

( * ) Notice: Subject to any disclaimer, the term of this patent is extended or adjusted under 35 U.S.C. 154(b) by 0 days.

(21) Appl. No.: 14/693,756

(22) Filed: Apr. 22, 2015

(65) Prior Publication Data

US 2015/0333133 A1 Nov. 19, 2015

(30) Foreign Application Priority Data

May 14, 2014 (EP) ..................................... 14168349

(51) Int. Cl.
 *H01L 29/40* (2006.01)
 *H01L 29/06* (2006.01)
 (Continued)

(52) U.S. Cl.
 CPC ...... *H01L 29/404* (2013.01); *H01L 21/67069* (2013.01); *H01L 29/063* (2013.01);
 (Continued)

(58) Field of Classification Search
 CPC . H01L 29/404; H01L 29/063; H01L 29/0696; H01L 29/8725; H01L 21/67069;
 (Continued)

(56) References Cited

U.S. PATENT DOCUMENTS 5,877,528 A * 3/1999 So .................. H01L 27/088
  257/331
6,670,650 B2 12/2003 Nemoto et al.
  (Continued)

FOREIGN PATENT DOCUMENTS

EP  1 188 189 B1  5/2010

OTHER PUBLICATIONS

Extended European Search Report for EP Patent Appln. No. 14176589.1 (dated Sep. 21, 2015).

*Primary Examiner* — Walter H Swanson
(74) *Attorney, Agent, or Firm* — Ohlandt, Greeley, Ruggiero & Perle, L.L.P.

(57) ABSTRACT

A semiconductive device comprising a body having: a first surface and an opposing second surface; a first semiconductive layer adjacent to the first surface; an active region comprising: a plurality of active trenches in the first surface, extending from the first surface into the first semiconductive layer, and having an active trench width, and a plurality of active cells; and a termination region at a periphery of the first surface comprising: at least one termination trench extending from the first surface into the first semiconductive layer, wherein the termination region has a width that is greater than the active trench width; and a number of termination trench separators having a width that is less than a width of the active cells, wherein the active trenches and the at least one termination trench each comprise a first insulator layer adjacent to the first semiconductive layer of the body.

17 Claims, 10 Drawing Sheets

(51) Int. Cl.
*H01L 21/67* (2006.01)
*H01L 29/66* (2006.01)
*H01L 29/872* (2006.01)

(52) U.S. Cl.
CPC ........ *H01L 29/0696* (2013.01); *H01L 29/407* (2013.01); *H01L 29/66143* (2013.01); *H01L 29/8725* (2013.01)

(58) Field of Classification Search
CPC ............. H01L 29/66143; H01L 29/407; H01L 27/0814; H01L 29/872; H01L 29/402; H01L 29/408
USPC ........................ 257/488; 438/454; 156/345.1
See application file for complete search history.

(56) References Cited

U.S. PATENT DOCUMENTS

| | | |
|---|---|---|
| 2002/0175342 A1* | 11/2002 | Tsui .................... H01L 27/0814 257/155 |
| 2003/0001215 A1 | 1/2003 | Wahl et al. |
| 2005/0173776 A1 | 8/2005 | Dalen et al. |
| 2006/0118833 A1 | 6/2006 | Lanois |
| 2012/0205772 A1 | 8/2012 | Chen |
| 2013/0228891 A1* | 9/2013 | Kao .................. H01L 21/28008 257/494 |
| 2014/0077287 A1 | 3/2014 | Xu et al. |

\* cited by examiner

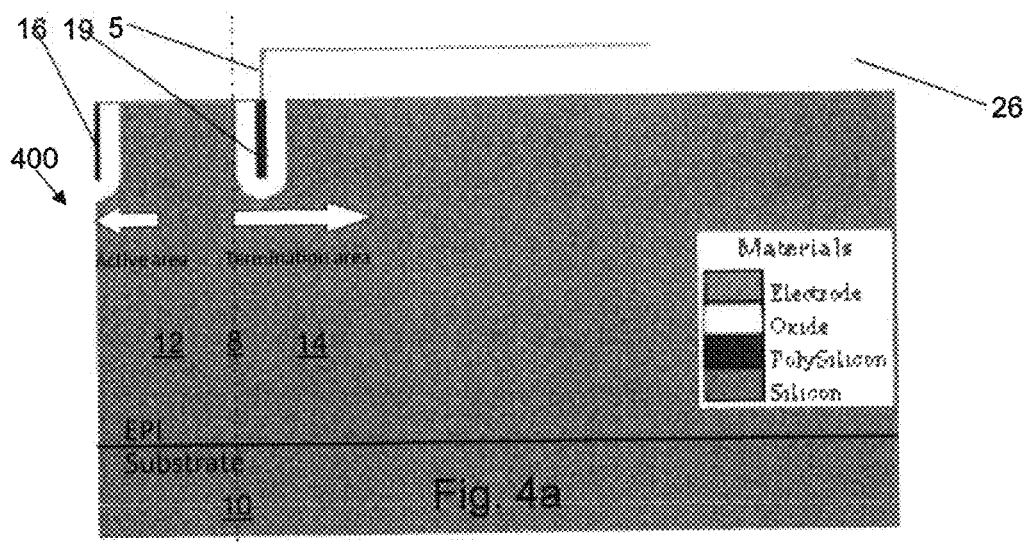
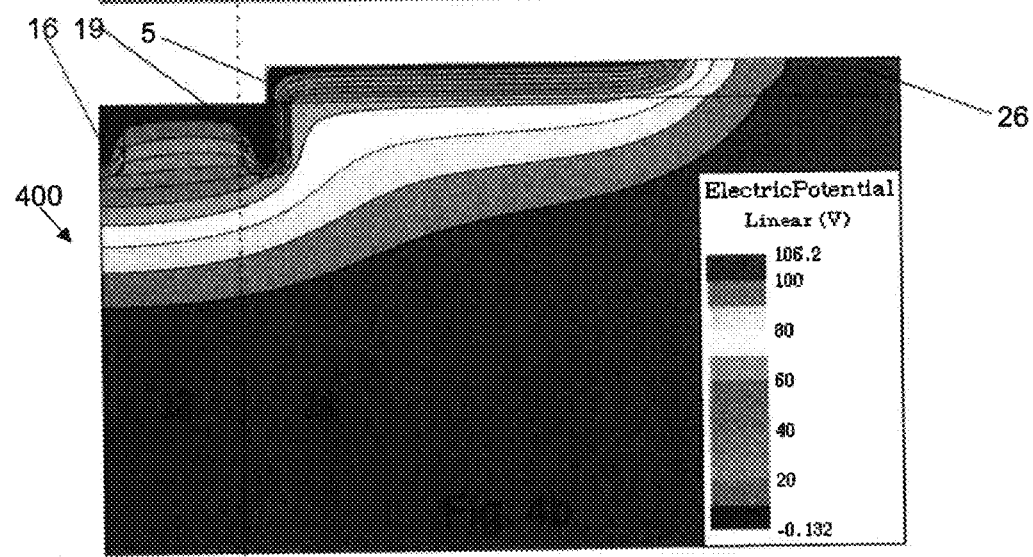
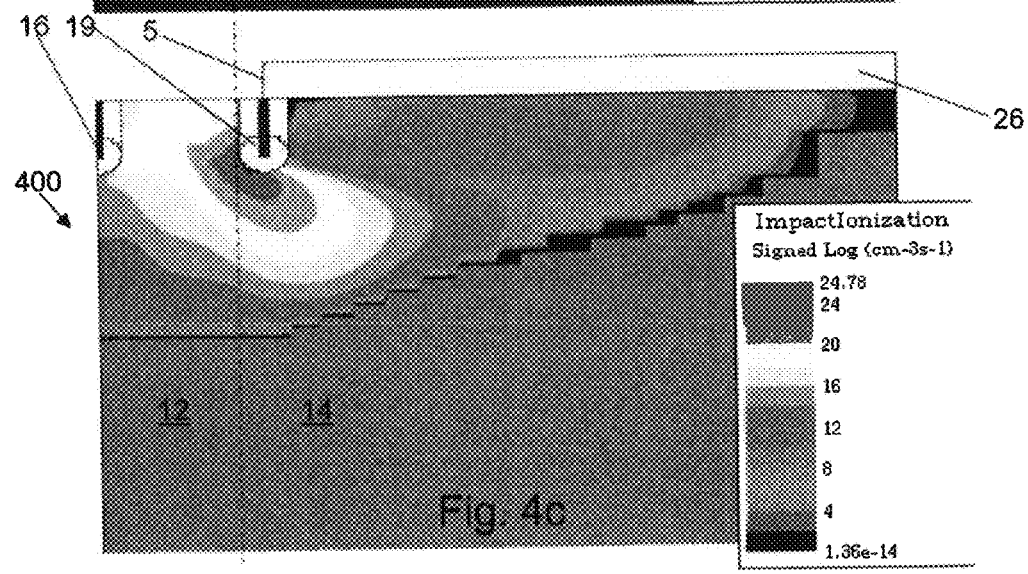

SEMICONDUCTIVE DEVICE AND ASSOCIATED METHOD OF MANUFACTURE

CROSS-REFERENCE TO RELATED APPLICATIONS

This application claims the priority under 35 U.S.C. § 119 of European patent application no. 14168349.0, filed on May 14, 2014, the contents of which are incorporated by reference herein.

The disclosure relates to a semiconductor device and associated method of manufacture. In particular, although not exclusively, the disclosure relates to reduced surface field (RESURF) devices such as trench Schottky diodes.

Conventional reduced surface field (RESURF) semiconductor devices are manufactured on a semiconductor substrate using epitaxial growth and implantation processes. Such devices may be either vertical, in which current passes through the device substantially perpendicular to the plane of the semiconductor substrate or horizontal, in which current passes through the device across the substrate.

Typical examples of RESURF structures include diodes, transistors (such as MOSFETs), or thyristors having a region, often known as the drift region, that is depleted in reverse bias at a voltage much less than breakdown. Increased reverse bias voltage will then lead to a relatively flat field profile. This enables the structure to support a larger voltage across it without breaking down in reverse bias than would otherwise be possible. This may be achieved, for example, by providing a plurality of p-type regions in an n-type drift region so that in reverse bias the depletion region of the p-n junctions includes substantially the whole of the drift region. Thus, RESURF structures may be used in high voltage applications.

For vertical RESURF structures, deep p-n junctions are required and it can be more convenient to manufacture these using a trench etch process, avoiding the need for multiple epitaxy. Some other advantages may be obtained using a trench structure.

These may include smaller pitch sizes due to a lower thermal budget which lowers the breakdown voltage at which vertical RESURF devices become attractive, and which also offer lower specific resistances. Trench etching can potentially result in a cheaper manufacturing process with fewer processing steps.

Trench-based RESURF Schottky diodes offer the advantage of a reduced epilayer resistance while still offering the same reverse standoff voltage. An important part of the RESURF design is the termination of the active trench region, since common termination technologies known from planar device designs may not be applicable. RESURF Trench Schottky diodes use a termination of the active trench-containing region which avoids altering the properties of the active cells in terms of the reverse standoff voltage. In particular, this means that it is desirable for the outermost, or peripheral, active cells or silicon mesa structures to exhibit the same electrical field distribution as all the inner active cells. One option to achieve this is to etch the whole termination region down to the level of the bottom of the trenches. Thereafter, a field plate can be applied to the device such that the electric field in the outermost cells is relatively undisturbed.

A significant disadvantage of etching away very wide areas in order to provide termination of the device is that black silicon may be generated by the dry etch process needed to produce such structures. Another disadvantage of such a design is that an additional passivation layer and non-planar surface structures may be required. In particular, the use of non-planar surface structure affects the performance of photolithography processes because a photo resist layer deposited on the surface may be uneven and so the precision of the lithography deteriorates. Moreover, such a termination region is commonly etched deeper than narrow trenches in the active region, since sidewall effects reduce the etch rate of narrow trenches. This effect causes a strong asymmetry between the active and termination regions, which again may limit the breakdown voltage.

Another possible option is the use of p-doped rings covered by field plates. However this approach may require additional lithographic and implantation steps and so may not provide a semiconductor device that can achieve the same break-down voltage performance as a trench terminated device.

According to an aspect of the invention there is provided a semiconductive device comprising a body having:
  a first surface and an opposing second surface;
  a first semiconductive layer adjacent to the first surface;
  an active region comprising:
    a plurality of active trenches in the first surface, the plurality of active trenches extending from the first surface into the first semiconductive layer and having an active trench width, and
    a plurality of active cells, each active cell provided in the first semiconductive layer adjacent to an active trench, the active cells having an active cell width; and
  a termination region at a periphery of the first surface comprising:
    at least one termination trench, the at least one termination trench extending from the first surface into the first semiconductive layer, and
    a number of termination trench separators having a width that is less than the active cell width, wherein the termination region has a width that is greater than the active trench width,
  wherein the active trenches and the at least one termination trench each comprise a first insulator layer adjacent to the first semiconductive layer of the body, and wherein conductive material is disposed on the first insulating layer within each of the active trenches.

The semiconductive device may be a reduced surface field semiconductive device. The semiconductive device may be a Schottky rectifier. Active trenches may be considered to be a first type of trench that are provided in an active region (a first region) of the device. Termination trenches may be considered to be a second type of trench that are provided in a termination region (a second region) of the device. The termination region may surround the active region. The termination region may be an edge termination region.

Conductive material may be disposed on the first insulating layer within each of the active trenches and the at least one termination trench. Filling the termination trench with conductive material may provide both improved break down performance and increase the ease of further manufacturing steps because the surface of the device is relatively planar compared to the case in which the termination trench is left void or filled with an insulator. Providing the same material in the active trenches and the at least one termination trench may also simplify the process of manufacturing the device. Alternatively, the at least one termination trench may comprise non-conductive material disposed on the first insulating layer within the at least one termination trench.

The first aspect covers embodiments in which a single, relatively wide termination trench is provided or in which a plurality of termination trenches are provided relatively close together.

The number of termination trench separators may be zero. The termination region may comprise only one (a single) termination trench. A termination trench separators is not required in such an example. The width of the single termination trench may be the same as (equal to) the width of the termination region.

The body may comprise a plurality of termination trenches. The termination region may comprise one or more termination trench separators. The width of the termination trench region may be equal to the sum of the widths of the plurality of termination trenches and the width or widths of the number of termination trench separators.

The at least one termination trench width may be greater than the active trench width. The device may comprise a first electrically conductive layer. The first electrically conductive layer may extend over substantially all of the active region and, optionally, the termination region. The body may comprise a second insulating layer disposed on material in the at least one termination trench. The first electrically conductive layer on the first surface may connect the active cells (portions of the first semiconductive layer) between the active trenches. The first electrically conductive layer may extend over substantially all of the second insulating layer.

The conductive material may comprise a metalloid or a metal. Preferably, the conductive material comprises poly-crystalline silicon. The poly-crystalline silicon may have a dopant level, which may be greater than $1 \times 10^{17}$ atoms.cm$^{-3}$. The dopant may be arsenic or phosphorous, for example. The first or second insulating layer may comprise a metalloid oxide or metalloid nitride. Silicon is an example of a metalloid. The at least one termination trench may be completely filled with conductive material within the first oxide layer.

The body may comprise a second semiconductive layer adjacent to the second surface. The first semiconductive layer may have a different conductivity to the second semiconductive layer. The semiconductive device may comprise a second electrically conductive layer disposed on the second surface.

The active trenches may have a depth that extends from the first surface into the first semiconductive layer. The active trenches may terminate in the first semiconductive layer. The depth of the active trenches may be the same as a depth of the at least one termination trench.

According to a second aspect of the invention there is provided a method of manufacturing a semiconductive device, comprising:
 providing a body having a first surface, an opposing second surface and a first semiconductive layer adjacent to the first surface within the body;
 providing an active region comprising a plurality of active trenches extending from the first surface into the first semiconductive layer and having an active trench width, wherein the active trenches define a plurality of active cells in the active region, each active cell provided in the first semiconductive layer adjacent to an active trench and having an active cell width;
 providing a termination region at a periphery of the first surface, the termination region comprising:
  at least one termination trench extending from the first surface into the first semiconductive layer, and
  a number of termination trench separators having a width that is less than the active cell width, the termination region having a width that is greater than the active trench width;
 forming a first insulator layer adjacent to the first semiconductive layer in the active trenches and the at least one termination trench;
 disposing conductive material within the first insulating layer in the active trenches and the at least one termination trench.

Conductive material may be disposed on the first insulating layer within each of the active trenches and the at least one termination trench.

According to a third aspect of the invention there is provided a semiconductor fabrication apparatus configured to perform the above method.

One or more embodiments of the invention will now be described, by way of example only, and with reference to the accompanying figures in which:

FIG. 4a illustrates a semiconductor device with a narrow termination trench;

FIG. 4b illustrates a simulation of an electric potential distribution overlaid on the semiconductor device of FIG. 4a;

FIG. 4c illustrates a simulation of an impact ionization distribution overlaid on the semiconductor device of FIG. 4a;

FIG. 4d illustrates a semi-log plot of the current against voltage at a second contact on the second surface of the body of the device for an isolated trench and the semiconductor device of FIG. 4a;

FIG. 7a illustrates a semiconductor device with a plurality of termination trenches similar to that described with reference to FIG. 2;

FIG. 7b illustrates a simulation of an electric potential distribution overlaid on the semiconductor device of FIG. 7a; and FIG. 7c illustrates a simulation of an impact ionization distribution overlaid on the semiconductor device of FIG. 7a.

Figure 1:
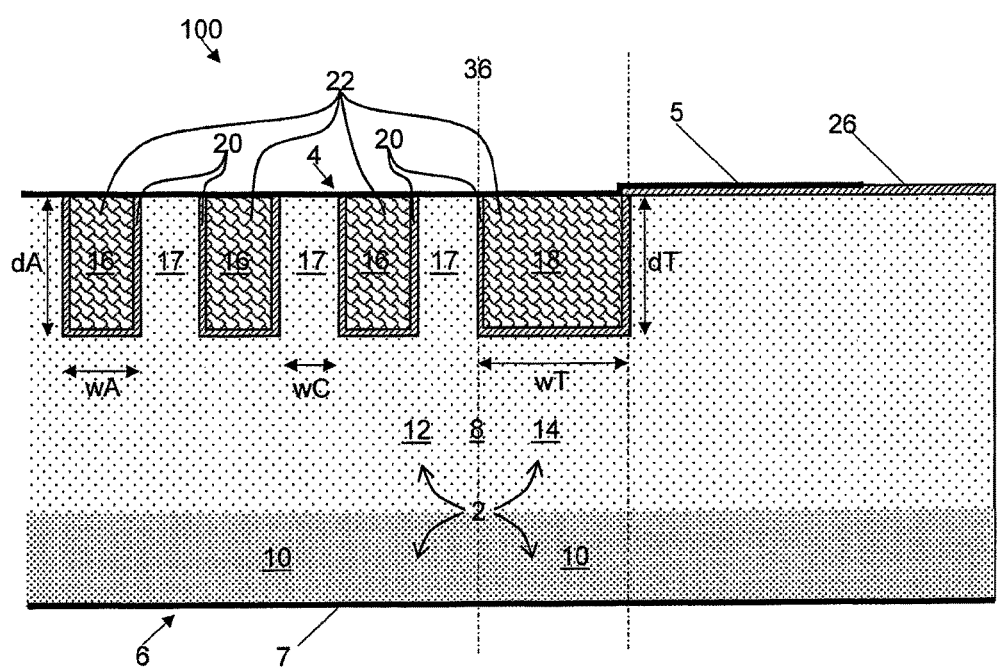
FIG. 1 illustrates a first semiconductive device.

FIG. 1 illustrates a first semiconductive device 100. In summary, the device 100 uses a termination trench 18 that is wider than trenches 16 in an active region of the device.

The width of the termination trench 18 can be designed such that field symmetry in the active region adjacent to the termination trench 18 is ensured and that filling the termination trench 18 with poly-crystalline silicon is still possible. The proposed termination design uses a wider trench in the termination region to ensure the symmetry of the electrical field in the outermost mesa and to prevent premature reverse bias breakdown during operation.

The device 100 comprises a body 2 that has a first surface 4 and an opposing second surface 6. A first semiconductive layer 8 is provided within the body 2 adjacent to the first surface 4. A second semiconductive 10 layer is provided adjacent to a second surface 6. The first semiconductive layer 8 contains a drift region and is an epitaxial layer that has been formed on the second semiconductive layer 10, which is a substrate layer. Typically, the substrate layer is made of mono-crystalline silicon. The doping concentration (n+) of the substrate may be, for example, $10^{18}$ to $10^{21}$ phosphorus or arsenic atoms per $cm^{-3}$. The epitaxial first semiconductive layer 8 typically has a higher resistivity than the substrate second semiconductive layer 10. The epitaxial layer and substrate may be of the same conductivity type, usually n-type. The choice of doping concentration and thickness for the drift region depends on the desired blocking voltage of the rectifier, but is usually in the range of, for example, $10^{15}$ to $10^{17}$ phosphorus or arsenic atoms per $cm^{-3}$ with a thickness of about 2 µm (micrometers) or more. The drift region may have a uniform doping concentration (n), for example of the order of $10^{15}$ dopant atoms per $cm^{-3}$. However, the drift region may have a doping concentration (n) that increases with depth in order to reduce the on-resistance of the device 100.

A second electrically conductive layer 7 is provided on the second surface 6 of the body 2. Aluminium or Ti—Ni—Ag are examples of commonly-used electrode materials suitable for ohmic-substrate connections.

The semiconductor device 100 has an active region 12 and an edge termination region 14, or perimeter region. These regions occupy separate volumes of the device 100 and can be defined by a surface 36 that passes through the body 2. The edge termination region 14 is provided in a periphery of the body and in some examples can surround the active region 12.

A plurality of active trenches 16 and active cells 17 are provided in the active region 12. The active cells 17 are provided by the portions of the active region 12 between the active trenches 16 and between the active trench and the termination trench. The active cells have an active cell width wC, which is typically 500 nm to 1500 nm. A first electrically conductive layer 5 forms a Schottky barrier with the active cells 17. The choice of material for the Schottky electrode depends on the desired barrier height, and specific examples of suitable commonly-used materials are nickel silicide or tungsten titanium.

The plurality of active trenches 16 extend from the first surface 4 into the first semiconductive layer 8 and have an active trench width wA (typically the plurality of active trenches 16 each have the same width wA across the first surface 4 in order to ensure symmetry). The active trench width wA may be 500 nm to 1000 nm.

The active region 12 also has a trench surface density. The trench surface density defines the volume of active trench per unit of the first surface 4 of body 2 (the trench surface density does not necessary relate to the density of material within a trench 16). In order for the device to work efficiently, the symmetry of the plurality of active trenches 16 should be high, and so the distribution density and width wA of active trenches 16 is relatively constant over the first surface 4 of the active region 12.

The plurality of active trenches 16 may be discrete columns, stripes or close-packed shapes, hexagonal or square lattice patterns of trenches, for example. In many cases, better results can be obtained using a stripe or close-packed design than is obtained by using columns, since such designs offer better RESURF at the same pitch (spacing between trenches).

The termination region 14 comprises a termination trench 18. The termination trench 18 extends from the first surface 4 into the first semiconductive layer 2. In this example, where only a single trench 18 is provided without any separating structures within the trench, the edge termination region 14 can be considered to be coterminous with the termination trench 18 in the plane of the first surface 4. The width of the termination trench 18 is therefore the same as the width wT of the termination region 14 in this example. The width wT of the termination region 14 is greater than the active trench width wA. That is, the width of the edge termination trench 18 is greater than the width wA of the active trench 16. Typically, the width wT of the edge termination trench 18 is 1.2 to 2 times greater than the width wA of the active trenches 16. Increasing the width of the termination trench improves the symmetry of the electric field in the active cell 17 that is adjacent to the termination region 18 and so improves the reverse voltage breakdown performance of the device. The improved performance achieved (at least in part by) increasing the width of the termination region 14 is discussed in relation to the simulated results of FIGS. 4 to 8 below.

The termination region 14 has a higher trench density than the active trench surface density because all of the edge termination region 14 area on the first surface is occupied by the termination trench 18 whereas the active region 12, which includes a plurality of active trenches 16, must also include regions of the first semiconductor layer 2 between the plurality of active trenches 16.

The first electrically conductive layer 5 is provided on the first surface 4 of the body 2. The first electrically conductive layer 5 extends over substantially all of the active region 12. The first electrically conductive layer plate 5 is provided on the termination trench 18 in the termination region 14 to spread out a depletion region in the first semiconductive layer 8 of the termination region 14 (as well as in the active region 12) so that the symmetry of the device is improved such that the termination region 14 can bear a breakdown voltage closer to that of the active area 12.

A passivation layer 26 is provided outside of the active region 12 in order to separate the first electrically conductive layer 5 from the first semiconductive layer 5. In this example, the termination region 14 is coincident with (has the same width as) the single termination trench 18 and so a passivation layer is not necessary in the termination region 14 because all of the termination region 14 is occupied by the termination trench 18. The passivation layer 26 is provided on the first surface 4 of the body 2 on an opposing side of the termination trench 18 to the active region 12.

The plurality of active trenches 16 and the termination trench 18 each comprise a first insulator layer 20 adjacent to the first semiconductive layer 8 of the body 2. Conductive material 22 is disposed on the first insulating layer 20 within each of the active trenches 16 and the termination trench 18. The first insulating layer 20 is relatively thin (100 to 200 nm, for example) and acts as a dielectric layer. The insulating material of the layer 20 can be provided by growing or depositing an oxide or nitride layer on the first semiconductor layer 8. The insulator layer 20 may be provided by the same material and the same formation step as the passivation layer 26. The conductive material 22 can be provided by a semiconductive or a metallic material such as poly-silicon or a metal or alloy. The trenches 16, 18 are completely filled with conductive material 22 within the first oxide layer 20 in this example. The conductive material 22 forms a co-planar surface with the first surface 4 of the body 2. Filling the termination trench 18 with conductive material may provide both improved break-down performance and increase the ease of further manufacturing steps because the surface of the device is relatively planar compared to the case in which the termination trench 18 is left void or filled with an insulator.

The plurality of active trenches 16 each have the same depth dA, which extends from the first surface 4 into the first semiconductive layer 8 and terminates in the first semiconductive layer 8. The active trenches 16 may be sufficiently deep to extend across most of the thickness of a drift region in the first semiconductor layer 8. Alternatively, trenches 16 may even extend slightly into the substrate 10, although performance of the device 100 may be degraded by such a modification.

The depth dA of the active trenches 16 is about the same as a depth dT of the edge termination trench 18, although it may be deeper.

In order to simplify processing of the device 100, the wide termination trench 18 can be split into several narrow trenches with very small silicon spacers, or separators, between them. Such a modification enables the termination trench depth dT to be made comparable to the active trench depth dA more easily. The electric field symmetry of the device can also therefore be improved. In addition, filling and planarization of the device after poly silicon deposition may be simplified. Still, the high breakdown voltage of the wide trench termination is maintained.

Figure 2A:
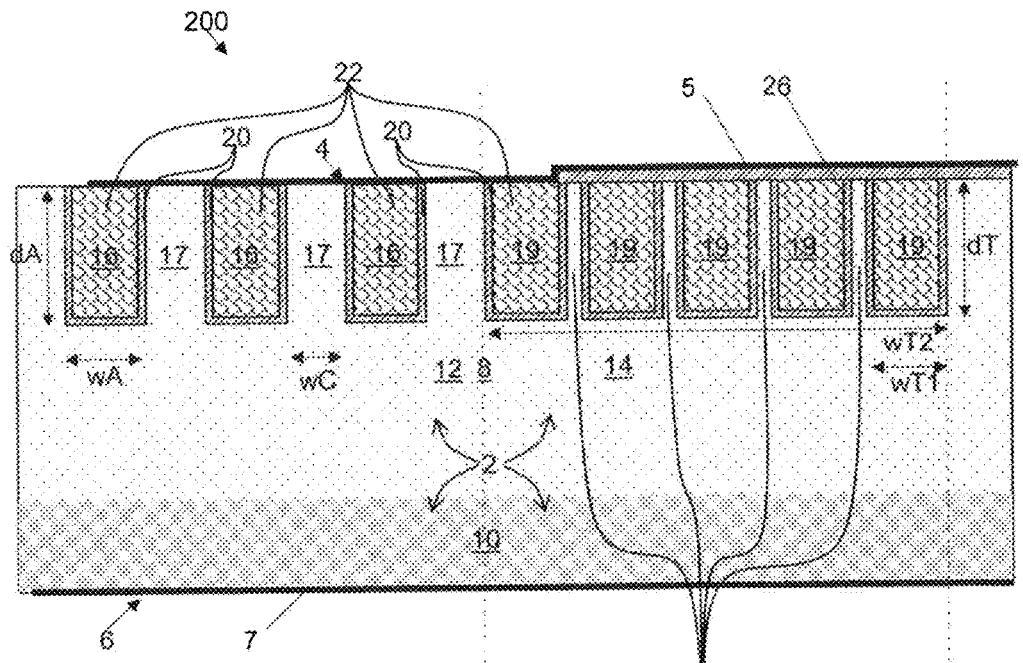
FIG. 2a illustrates a second semiconductive device with a termination region covered by an insulating layer.
Figure 2B:
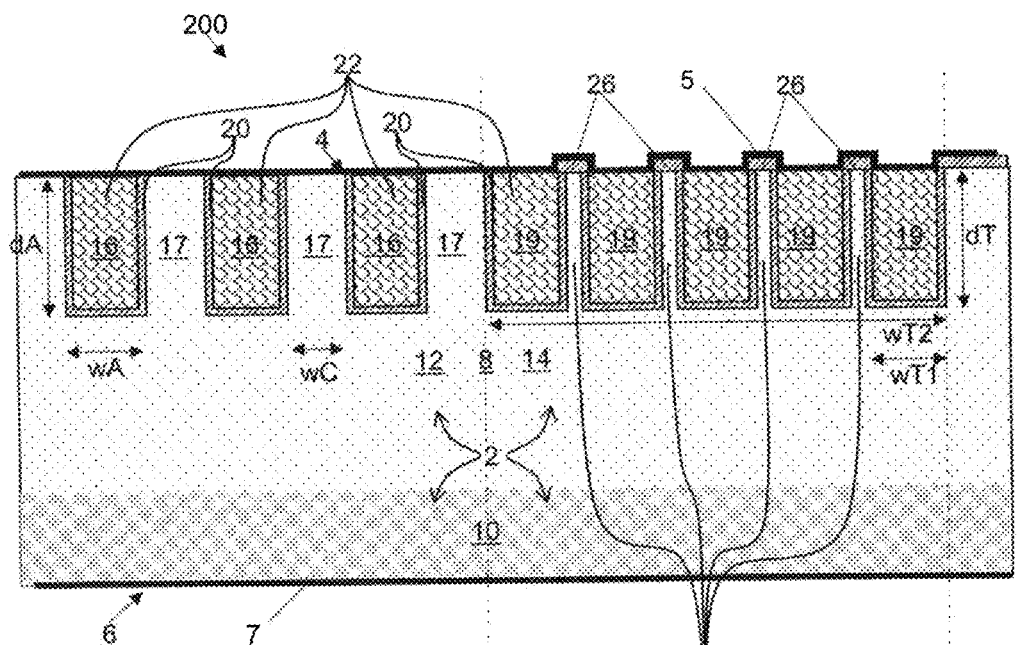
FIG. 2b illustrates the second semiconductive device with a termination region in which termination trench separations are covered by an insulating layer

FIGS. 2a and 2b illustrate a second semiconductor device 200, which is similar in many respects to the device described with reference to FIG. 1. In these examples, the body 2 of the device 200 comprises a plurality of termination trenches 19 within the edge termination region 14. The plurality of termination trenches 19 are separated by termination trench separators 24 (which may simply be portions of the first semiconductive region 8). The proposed termination design uses the plurality of trenches 19 in the termination region 14 to ensure the symmetry of the electrical field in the outermost mesa and to prevent premature reverse bias breakdown during operation.

The plurality of active trenches 16 are each separated from one another by an active cell 17 with a width wC. In this example, each individual termination trench 19 can be considered to have a width wT1. The individual termination trenches 19 can have the same width wT1. The width wT1 of the termination trenches 19 may be similar to or greater than the width wA of the active trenches. The termination region has a total width wT2 that extends from the edge of the termination trench 19 that boarders the active region 12 to the edge of the termination trench 19 that is on the periphery of the device 200. The total width wT2 of the termination region is greater than the active termination width wA. The plurality of termination trenches 19 are each separated from one another by a termination trench separator 24. The width of the termination trench separator 24 is less than the active cell width wC. The termination trenches 19 can therefore be considered to be in relatively close proximity to one another (compared to the active trenches 16) because they are separated very narrow mesa structure 24. The trench separator 24 may have a width that is one tenth of the terminal trench width wT1. The total width of the termination region 14 is equal to the sum of the widths of the termination trench separators 24 added to the sum of the widths of the termination trenches 19. The provision of a plurality of termination trenches 19, instead of one wide trench, simplifies the polycrystalline silicon fill process and the further processing of the device 200.

The device 200 also differs from that illustrated in FIG. 1 in respect of the arrangement of the first electrically conductive layer 5. The arrangement of the first electrically conductive layer 5 is independent of the arrangement of the termination trench 18 or trenches 19. That is, the arrangement of the first electrically conductive layer 5 shown in FIG. 1 could be provided with the termination trench structure illustrated in FIG. 2. Similarly, the arrangement of the first electrically conductive layer 5 shown in FIG. 2 could be provided with the termination trench 18 illustrated in FIG. 1.

In the arrangement of FIG. 2a, a second insulating layer 26 is disposed on the edge termination region 14, and on the conductive material 22 in the plurality of termination trench 19. The first electrically conductive layer 5 extends over the second insulating layer 26. The second insulating layer 26 may be provided as a silicon nitride layer, for example. The first electrically conductive layer 5 is also provided on the first surface 4 of the body 2 in the active region 12 in order to connect active cells 17 (portions of the first semiconductive layer 8 that are between the active trenches 16) together. The first electrically conductive layer 5 in the active region 12 acts as the Schottky contact as is known in the art and as described with reference to FIG. 1. As a further alternative, the second insulating layer 26 can extend over the first electrically conductive plate 5 in the active region 12 in order to provide mechanical protection to the device 100.

FIG. 2b illustrates an alternative arrangement of the first electrically conductive layer 5. A passivation layer 26 is provided on the first surface 4 of the edge termination region 14 on the termination trench separators 24. The passivation layer 26 is an extension of the insulator layer 20 and may be formed in the same manufacturing step as the insulator layer 20. The passivation layer 26 and insulator layer 20 may be provided by a silicon oxide layer, for example. The first electrically conductive layer 5 is in contact with the conductive material 22 in the termination trenches 19 on the first surface 4 in the termination region 14.

In general, the termination trenches can be left electrically floating or be connected to the first conductive layer 5.

FIGS. 3a to 3h illustrate steps in a process for manufacturing a third semiconductive device.

Figure 3A:
FIGS. 3a to 3h illustrates a process for manufacturing a third semiconductive device.

The process starts with deposition and patterning of a hardmask 30 on a first surface 4 of a body 2 of a precursor semiconductor to provide the structure 301 shown in FIG. 3a. The body 2 has a second surface 6 opposing the first surface 4. A first semiconductive layer 8 is provided within the body 2 adjacent to the first surface 4. A second semiconductive 10 layer is provided adjacent to a second surface 6. The first semiconductive layer 8 is an epitaxial layer that has been formed on the second semiconductive layer 10, which is a substrate layer.

Figure 3B:
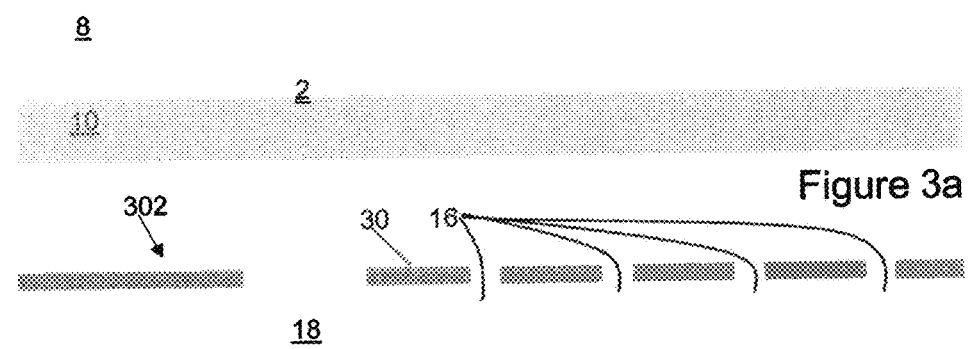

The next step is to dry-etch active trenches 16 and at least one termination trench 18 by using a hardmask 30 to provide the structure 302 shown in FIG. 3b.

Figure 3C:
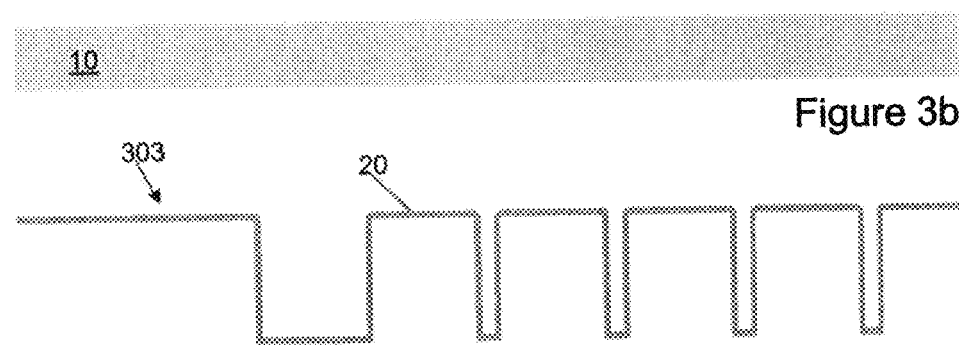

After dry-etching, the hardmask 30 is removed and the entire wafer body is covered with a first insulator or dielectric layer 20, which may be $SiO_2$, to provide the structure 303 shown in FIG. 3c.

Figure 3D:
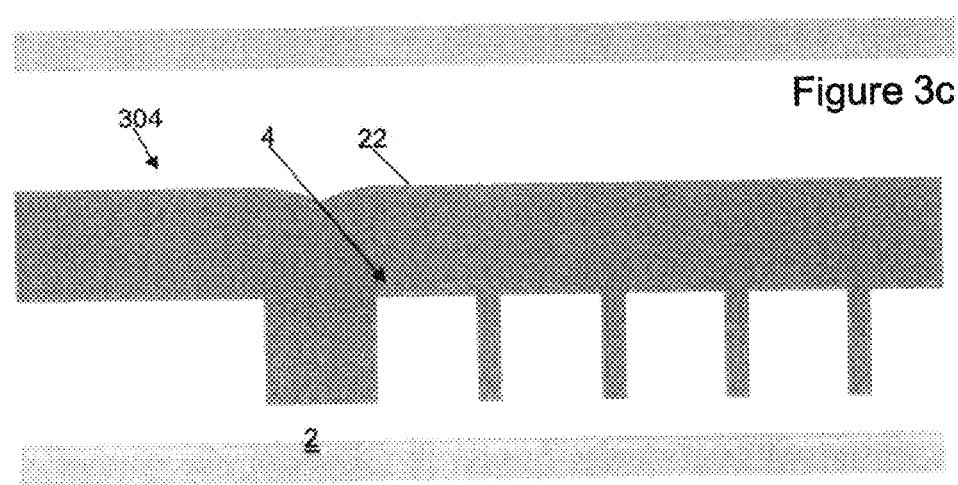

A layer of conductive material 22, which may be polycrystalline silicon, is deposited in order to fill the trenches and so provide the structure 304 shown in FIG. 3d. The conductive material 22 also covers the first surface 4 of the body 2.

Figure 3E:
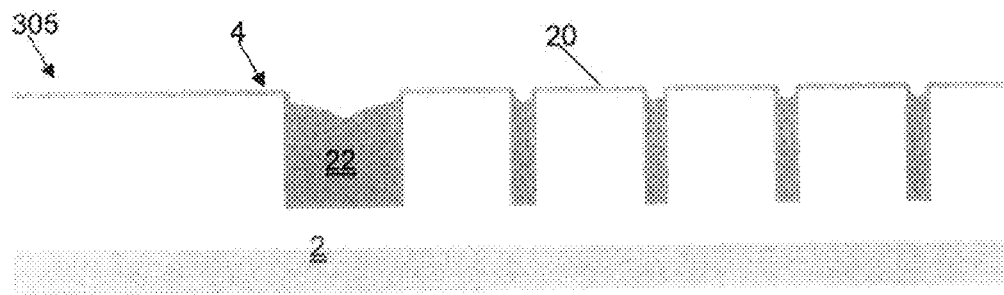

In FIG. 3e the conductive material 22 that covered the first surface 4 of the body 2 has been removed from the structure 305. The poly-crystalline silicon conductive material 22 now fills 80% or 90% of the volume bounded by the first oxide layer 20 and the plane of the first surface 4 because some of the polycrystalline material 22 has been removed from the centre of the trenches.

Figure 3F:
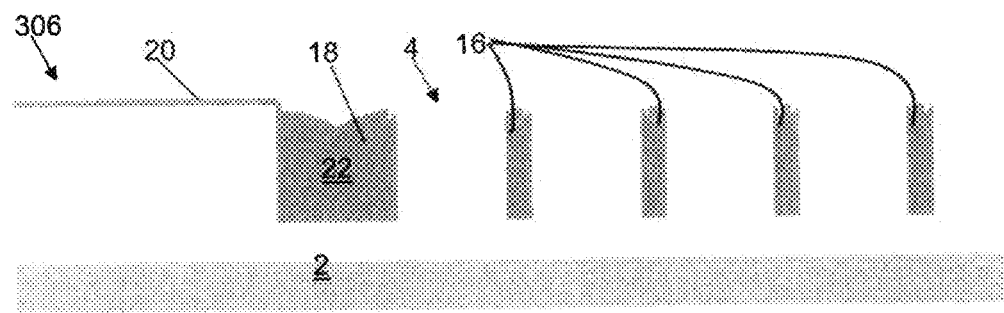

The first insulator layer 20 is removed from the first surface 4 between the active trenches 16 and from the first surface 4 between the active trenches 16 and the termination trench 18. The resultant structure 306 is shown in FIG. 3f.

Figure 3G:
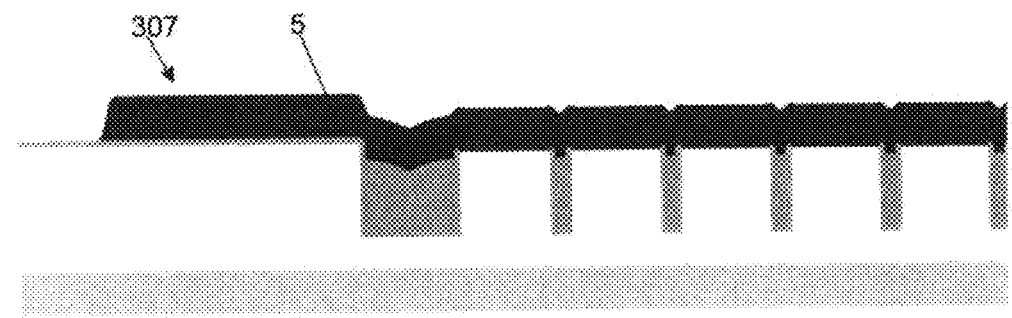
Figure 3H:
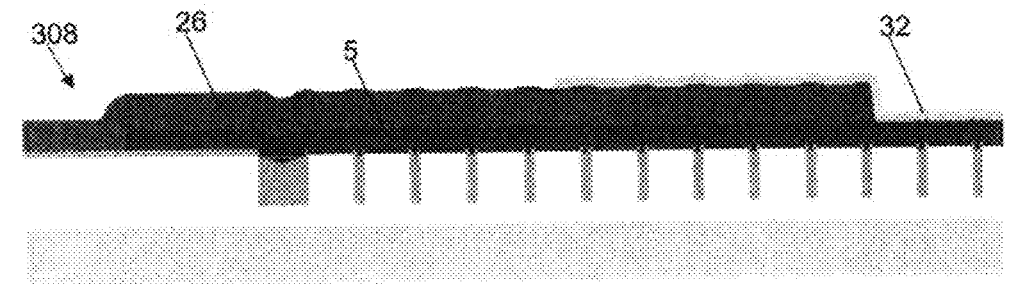

Now a Schottky electrically conductive layer 5 can be deposited on the first surface 4 and patterned as shown in structure 307 in FIG. 3g. The effect of this is that the trench 18 is again filled with conductive material. The Schottky electrically conductive layer 5 is then coated with interconnect metallization. After that, the device 307 can be protected by a second insulator layer 26, which may be silicon nitride layer, which is then structured. A soft solder layer 32 is deposited on the conductive layer 5 in order to prepare the device for assembly. The final schematic cross section of the device 308 is shown in FIG. 3h. Alternatively, the soft solder layer 32 can be deposited directly on the interconnect metallization 5 and the second passivation layer can be omitted.

Figure 3I:
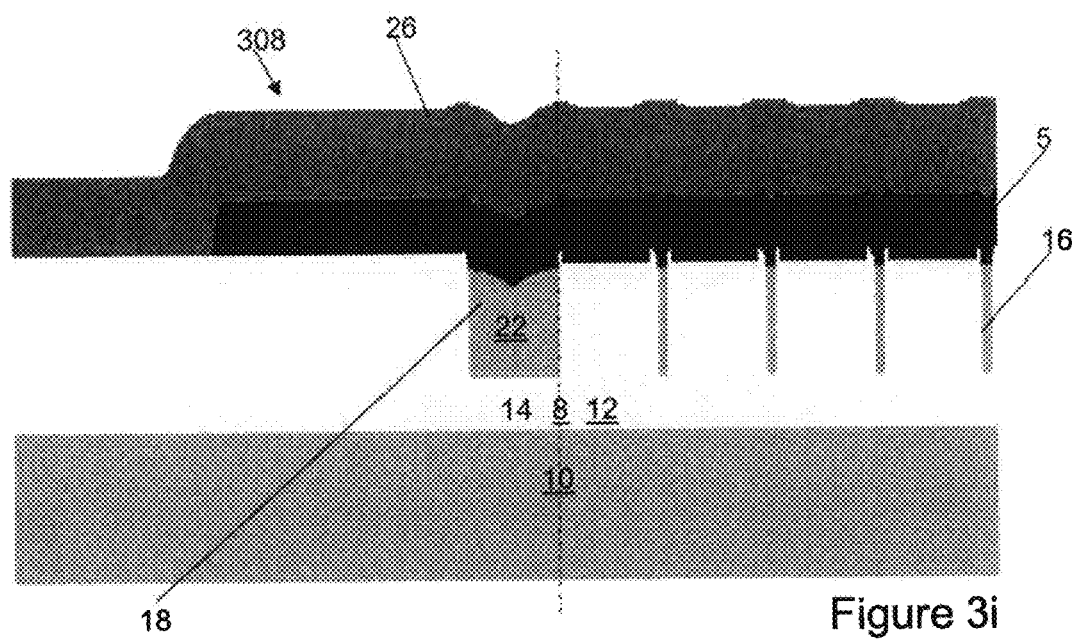
FIGS. 3i and 3j illustrate in further detail the device shown in FIG. 3h
Figure 3J:
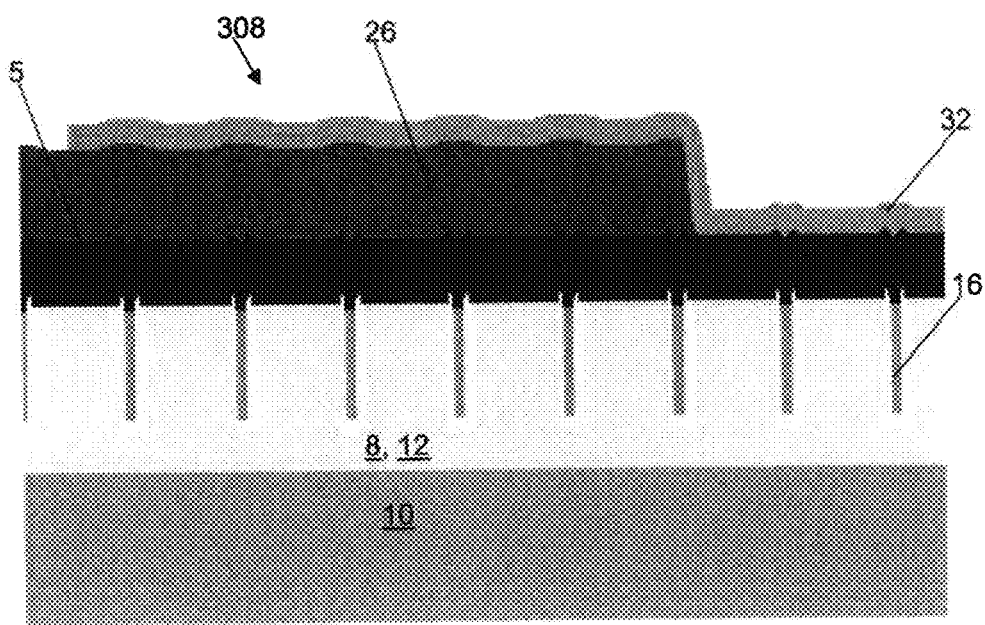

FIGS. 3i and 3j illustrate in further detail the device 308 shown in FIG. 3h. FIG. 3i illustrates the edge termination region and a portion of the active region covered by the second insulating layer 26. FIG. 3j illustrates the portion of the active region covered by the second insulating layer 26 and a portion in which the solder 32 is in direct contact with the Schottky electrically conductive layer 5.

The performance of exemplar devices in accordance with the invention are discussed with reference to FIGS. 5 to 7. For comparison, a simulation of a semiconductor device 400 in which the termination trench has the same dimension to the active trenches 16 in the active area 12 is first described with reference to FIGS. 4a to 4d.

FIG. 4a illustrates a semiconductor device 400 with a narrow termination trench 19. The termination trench width is equal to the active trench width. With the exception of the number of terminations trenches, the device 400 is similar to that discussed with reference to FIG. 2. Corresponding reference numerals are used between the figures to describe similar structures. As in FIG. 2, a field plate 5 is provided over the termination region 14 in order to improve the symmetry of the electric field at the periphery of the active region 12.

Figure 4D:
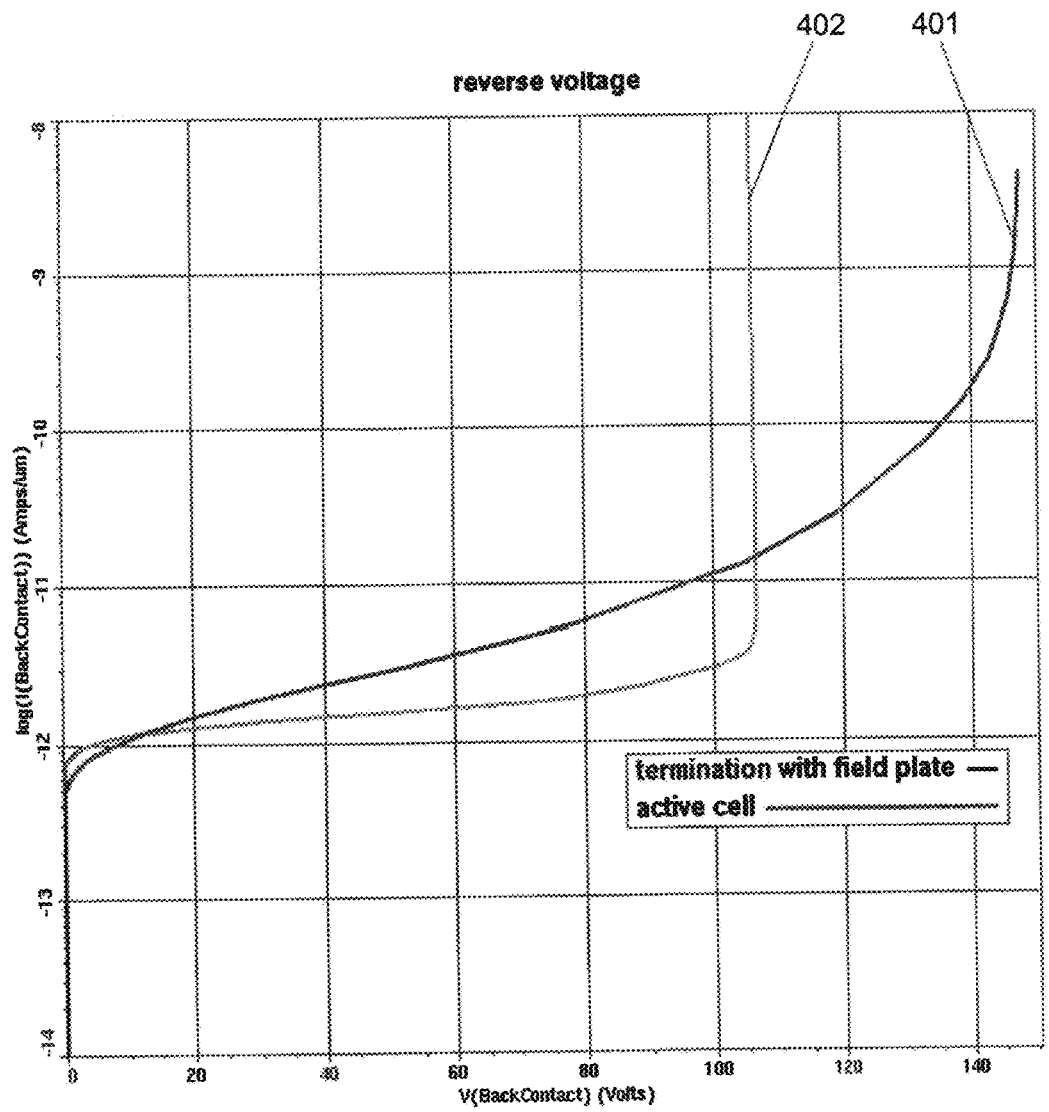

Turning now to FIG. 4d, FIG. 4d illustrates a semi-log plot of current against reverse bias voltage at a second contact on the second surface of the body of the device for the semiconductor device of FIG. 4a and, for comparison, a single active trench without a field plate. A curve 401 illustrates the profile for the single active trench in a 100 V RESURF Schottky diode cell design. Reverse breakdown occurs at around 145 V. A curve 402 shows the reverse breakdown of an active cell with a metal field plate termination (as shown in FIG. 4a) with the standard trench gives a much lower (73%) breakdown voltage (around 105 V) than the active cell alone. Current flow is relatively insensitive to reverse bias below 100V and remains around $1 \times 10^{-12}$ A/μm for the cell geometry shown in FIG. 4. Current increase is asymptotically at breakdown.

Returning to FIG. 4b, FIG. 4b illustrates a simulation of an electric potential distribution overlaid on the semiconductor device 400 of FIG. 4a when a reverse current density of $1 \times 10^{-8}$ A/μm is applied across the device 400. The lower termination breakdown voltage is caused by the asymmetry in the electric potential distribution at the termination trench 19 compared to the potential between active trenches 16.

FIG. 4c illustrates a simulation of an impact ionization distribution overlaid on the semiconductor device 400 of FIG. 4a with the device in the same condition. Early breakdown occurs at the inner corner of the termination trench 19 on the boarder of the active region 12, as indicated by the higher ionization rate in this region.

Figure 5A:
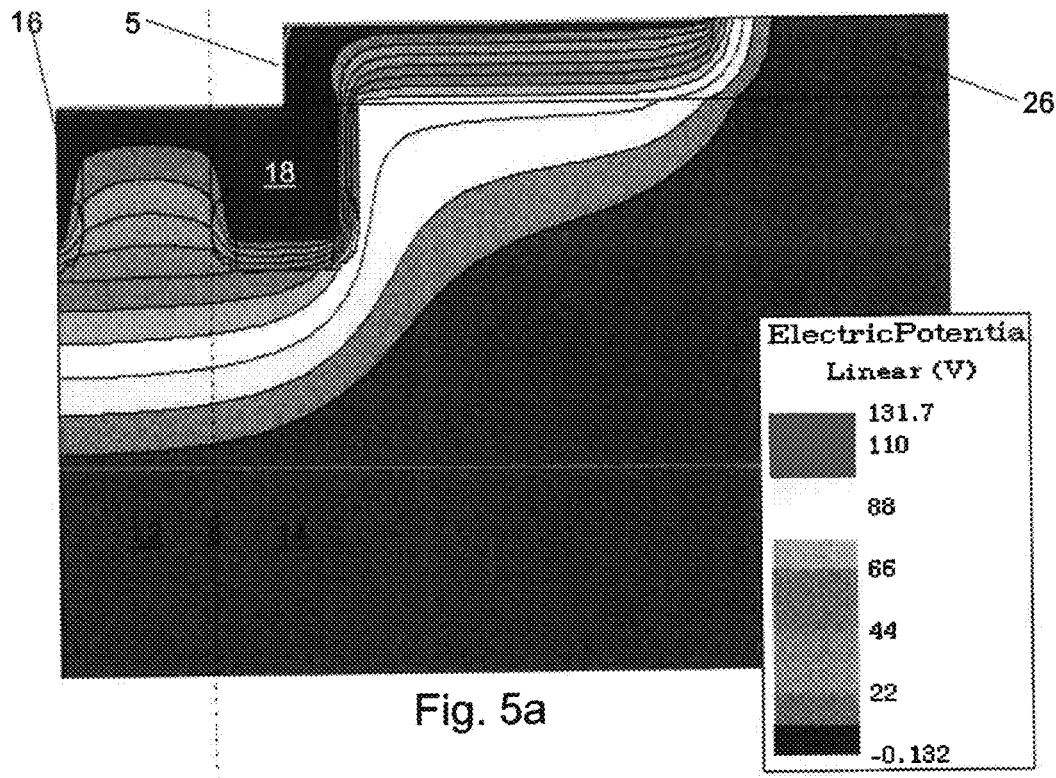
FIG. 5a illustrates a simulation of an electric potential distribution overlaid on the semiconductor device similar to those of FIGS. 1 and 2.
Figure 5B:
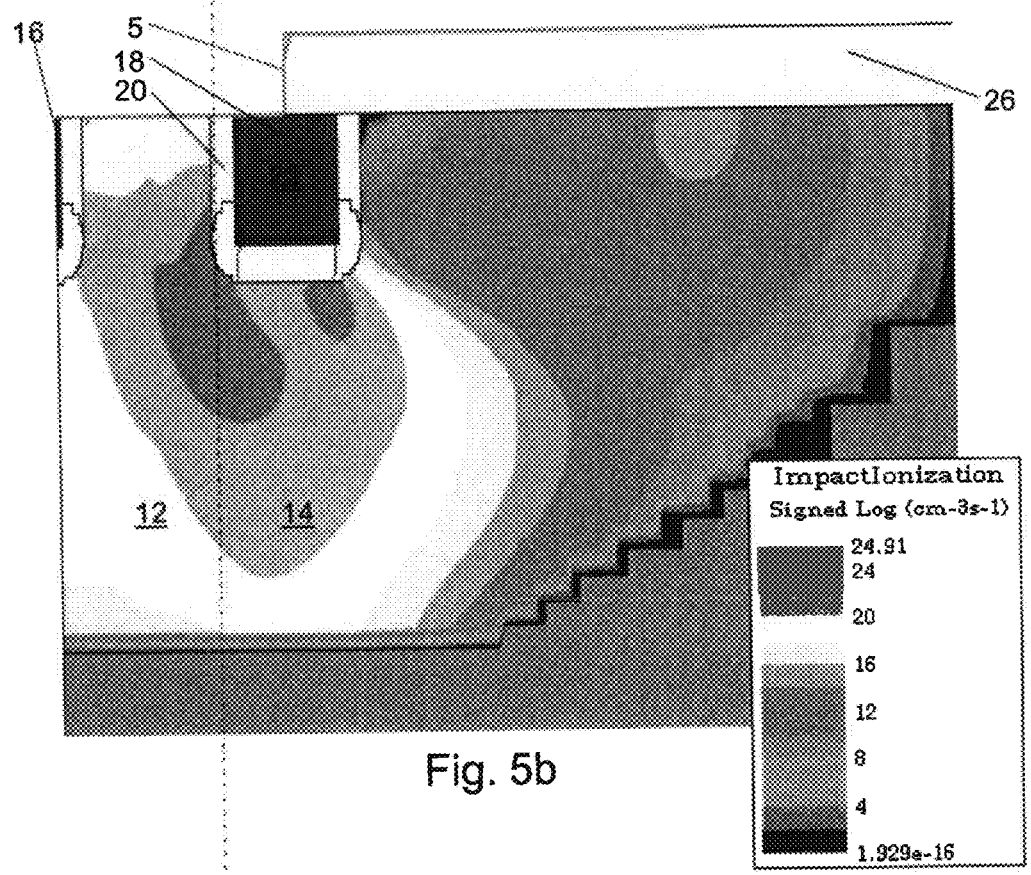
FIG. 5b illustrates a simulation of an impact ionization distribution overlaid on the semiconductor device that is similar to those of FIGS. 1 and 2.

FIGS. 5a and 5b relate to a device 500 with a single termination trench 18 that is wider than the active trenches 16 such as that described in relation to FIG. 1.

FIG. 5a illustrates a simulation of an electric potential distribution overlaid on the semiconductor device 500. The symmetry of the electric field in the active cell between the active trench 16 and the termination trench 18 is improved because the potential lines in this cell have a higher symmetry than the example shown in FIG. 4b. The field strength outside the active region 12 is accordingly reduced. FIG. 5b illustrates a simulation of an impact ionization distribution overlaid on the semiconductor device 500. The impact ionization occurs at a higher voltage in FIG. 5b than in the example shown in FIG. 4c.

Figure 6:
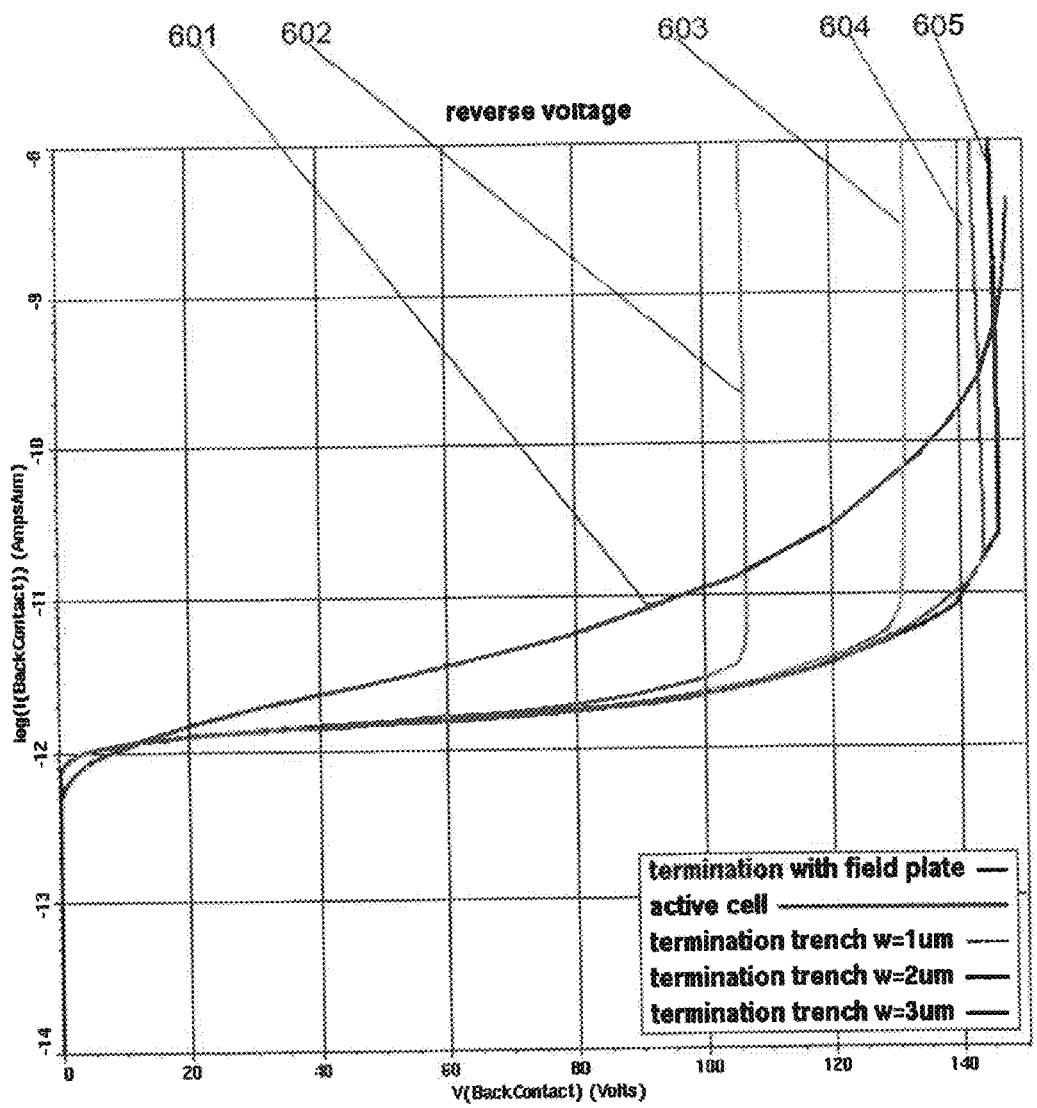
FIG. 6 illustrates a semi-log plot of the current against voltage at a second contact on the second surface of the body of the device for an isolated trench and the semiconductor device of FIG. 4a and a number of devices with termination trenches of different widths.

FIG. 6 illustrates a semi-log plot of the current against reverse voltage at a second contact on the second surface of the body of the device 500 for various different widths of termination trenches. Curves 601 and 602 relate to the curves discussed with reference to FIG. 4d above.

As a trend, the reverse breakdown voltage increases as a function of the width of the termination trench. The termination trench width in between the passivation oxide corresponding to curve 602 is 0.2 μm. Breakdown occurs at about 105 V for curve 602. The termination trench width corresponding to curve 603 is 1 μm. Breakdown occurs at about 130 V for curve 603. The termination trench width corresponding to curve 604 is 2 μm. The breakdown occurs at about 142 V for curve 604. The termination trench width corresponding to curve 605 is 3 μm. Breakdown occurs at about 145 V for curve 605. When the termination trench width is approximately 2 or 3 μm (10 or 15 times the active trench width), the breakdown voltages in the active region and in the termination region are very close to each other.

Figure 7C:
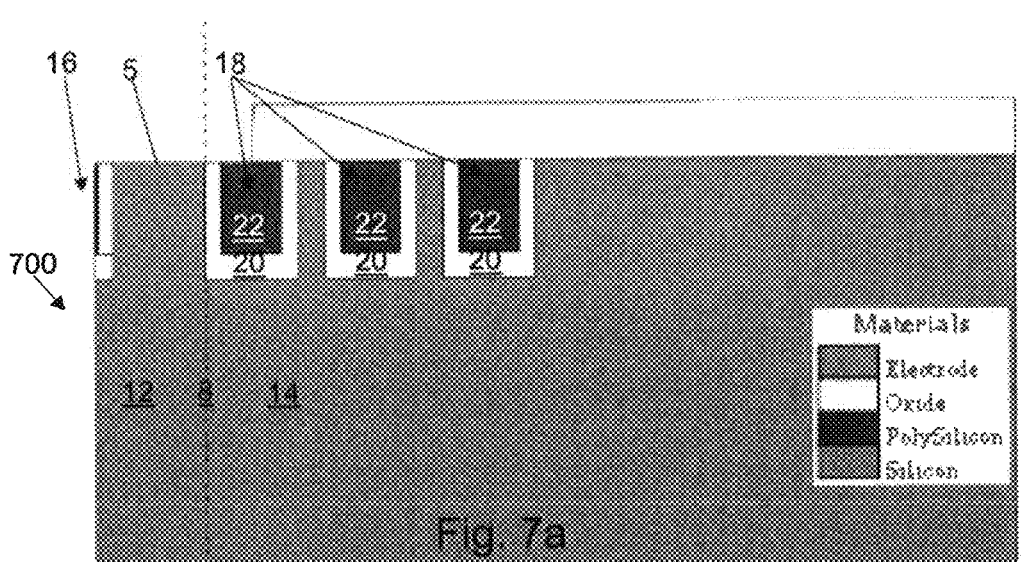
Figure 7C:
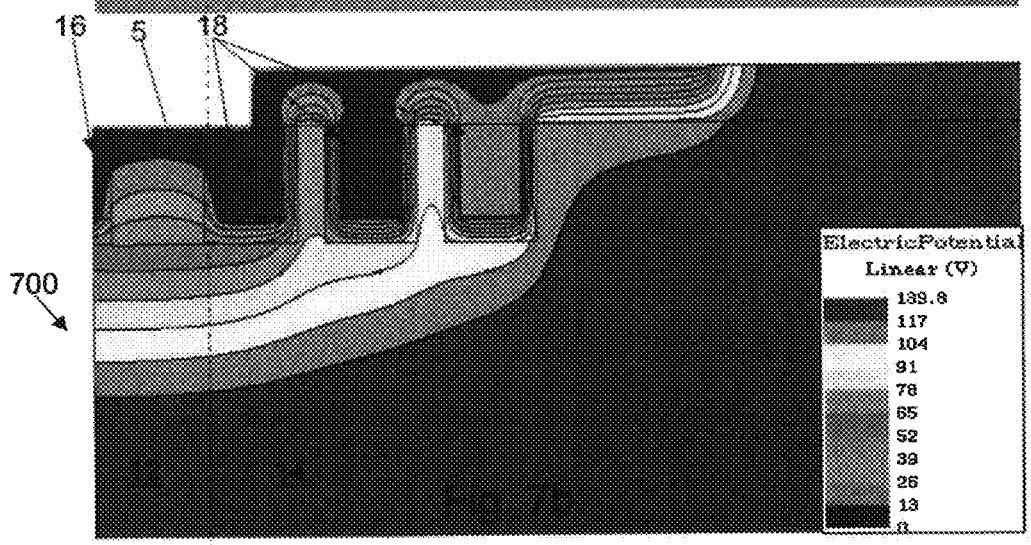
Figure 7C:
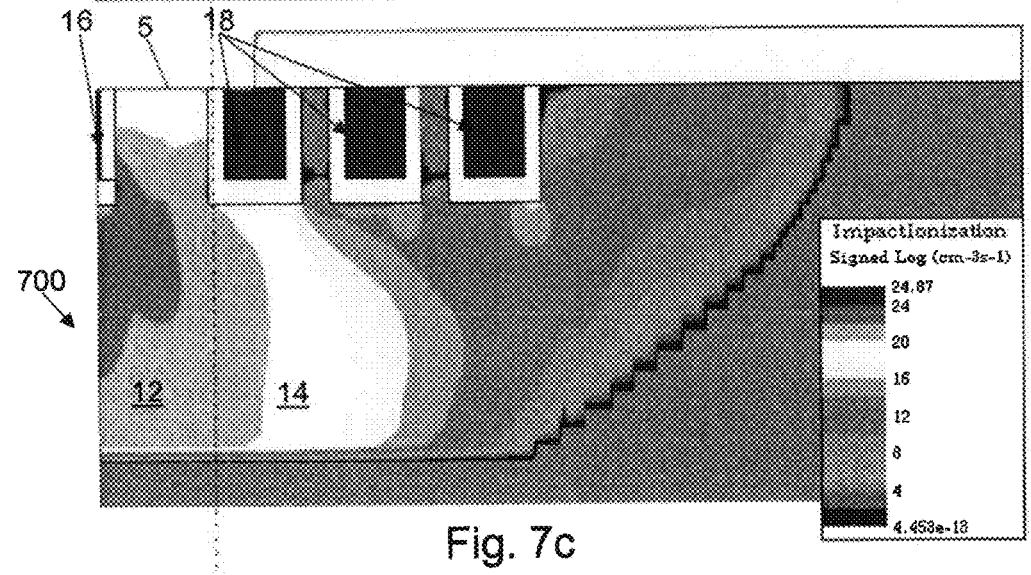

FIG. 7 relates to a simulation of a semiconductor device 700 with a structure similar to that of FIG. 2. FIG. 7a illustrates the semiconductor device 700 having a plurality of termination trenches. FIG. 7b illustrates a simulation of an electric potential distribution overlaid on the semiconductor device 700. There is a high degree of symmetry of the potential in the last active cell due to the plurality of termination trenches. FIG. 7c illustrates a simulation of an impact ionization distribution overlaid on the semiconductor device of FIG. 7a. In this example, avalanche breakdown occurs at the corner of the active cell that is associated with the active trench, rather than the termination trench, and so the termination trench may be considered not to be limiting on the breakdown voltage of the device 700.

The invention claimed is:
1. A semiconductive device comprising a body having:
a first surface and an opposing second surface;
a first semiconductive layer adjacent to the first surface;
an active region comprising:
a plurality of active trenches in the first surface, each of the plurality of active trenches extending from the first surface into the first semiconductive layer and having an active trench width, and a plurality of active cells, each active cell provided in the first semiconductive layer adjacent to a separate one of the plurality of active trenches, each of the active cells having an active cell width between an adjacent pair of the active trenches; and a termination region at a periphery of the first surface comprising:

at least two termination trenches, each of the at least two termination trenches extending from the first surface into the first semiconductive layer and having a termination trench width, and at least one termination trench separator separating the at least two termination trenches and having a width that is less than the active cell width and the termination trench width, wherein the termination region has a width that is greater than the active trench width, wherein the active trenches and the at least two termination trenches each comprise a first insulator layer adjacent to the first semiconductive layer of the body, and wherein conductive material is disposed on the first insulator layer within each of the active trenches.

2. The semiconductive device of claim 1, wherein each of the at least two termination trenches has a width across the first surface that is greater than the active trench width.

3. The semiconductive device of claim 1, further comprising a first electrically conductive layer that extends over substantially all of the active region and the termination region.

4. The semiconductive device of claim 1, wherein the body comprises a second insulating layer disposed on material in the at least two termination trenches.

5. The semiconductive device of claim 4, further comprising a first electrically conductive layer on the first surface that connects the active cells between the active trenches and extends over the second insulating layer.

6. The semiconductive device of claim 1, wherein the conductive material comprises poly-silicon or a metal.

7. The semiconductive device of claim 1, wherein the at least two termination trenches are completely filled with conductive material within the first insulator layer.

8. The semiconductive device of claim 1, wherein the body has a second semiconductive layer adjacent to the second surface, the first semiconductive layer having a different conductivity to the second semiconductive layer.

9. The semiconductive device of claim 8, comprising a second electrically conductive layer disposed on the second surface.

10. The semiconductive device of claim 1, wherein the active trenches have a depth that extends from the first surface into the first semiconductive layer and terminate in the first semiconductive layer.

11. The semiconductive device of claim 10, wherein the depth of the active trenches is the same as a depth of the at least two termination trenches.

12. The semiconductive device of claim 1, wherein each of the at least two termination trenches has a width that is at 1.2 to 2 times greater than the active trench width.

13. The semiconductive device of claim 1 wherein the width of the trench separator is about one tenth the width of the terminal trench width.

14. A semiconductive apparatus comprising:
an active region of a semiconductive layer;
each of a plurality of active trenches configured and arranged in the active region and having an active trench width;

each of a plurality of active cells configured and arranged adjacent to one of the active trenches and having an active cell width; and a termination region adjacent to the active region and having
a width that is greater than the active trench width,
a plurality of termination trenches extending into the semiconductive layer,
a plurality of termination trench separators separating each of the plurality of termination trenches, wherein each termination trench separator has a width that is less than the active cell width and the termination trench width, and
a trench surface density greater than a trench surface density of the active region.

15. The apparatus of claim 14, further comprising an insulator layer adjacent to the semiconductive layer and covering at least a portion of a surface area respectively associated with each of the plurality of termination trenches, and wherein the termination region has a passivation layer on a surface of the semiconductive apparatus opposite the semiconductive layer.

16. The apparatus of claim 14, wherein the termination region further includes a passivation layer having a plurality of insulation layer extensions configured and arranged to extend in a direction opposite the semiconductive layer, wherein each insulation layer extension is in contact with at least two termination trenches.

17. A semiconductive device comprising a body having:
a first surface and an opposing second surface;
a first semiconductive layer adjacent to the first surface;
an active region comprising:
a plurality of active trenches in the first surface, the plurality of active trenches extending from the first surface into the first semiconductive layer and having an active trench width, and
a plurality of active cells, each active cell provided in the first semiconductive layer adjacent to an active trench, each of the active cells having an active cell width between an adjacent pair of the plurality of active trenches; and a termination region at a periphery of the first surface comprising:
at least two termination trenches, each of the at least two termination trenches extending from the first surface into the first semiconductive layer and having a termination trench width, and
at least one termination trench separator separating the at least two termination trenches and having a width that is less than the terminal trench width of each of the at least two termination trenches and the active cell width, wherein the termination region has a width that is greater than the active trench width, wherein the width of trench separator is at least one tenth the width of the terminal trench width,
wherein the active trenches and the at least two termination trenches each comprise a first insulator layer adjacent to the first semiconductive layer of the body, and wherein the first insulator layer has a conductive material disposed thereon in each of the active trenches.

* * * * *